(12) United States Patent
Huang

(10) Patent No.: US 6,528,876 B2
(45) Date of Patent: Mar. 4, 2003

(54) SEMICONDUCTOR PACKAGE HAVING HEAT SINK ATTACHED TO SUBSTRATE

(75) Inventor: Chien Ping Huang, Hsinchu (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/893,110

(22) Filed: Jun. 26, 2001

(65) Prior Publication Data

US 2002/0079593 A1 Jun. 27, 2002

(30) Foreign Application Priority Data

Jun. 26, 2000 (TW) ........................................ 89112494 A

(51) Int. Cl.⁷ ............................................. H01L 23/34
(52) U.S. Cl. ........................................ 257/706; 257/796
(58) Field of Search ................................ 257/706, 778, 257/796

(56) References Cited

U.S. PATENT DOCUMENTS

| | | | | |
|---|---|---|---|---|
| 5,482,898 A | * | 1/1996 | Marrs .......................... | 29/827 |
| 5,598,321 A | * | 1/1997 | Mostafazadeh et al. ...... | 165/185 |
| 5,977,626 A | * | 11/1999 | Wang et al. ................. | 257/691 |
| 6,008,536 A | * | 12/1999 | Mertol ........................ | 257/704 |
| 6,208,519 B1 | * | 3/2001 | Jiang et al. ................. | 257/706 |
| 6,246,115 B1 | * | 6/2001 | Tang et al. .................. | 257/675 |

* cited by examiner

*Primary Examiner*—David Nelms
*Assistant Examiner*—Tu-Tu Ho
(74) *Attorney, Agent, or Firm*—Peter F. Corless; Steven M. Jensen; Edwards & Angell, LLP

(57) ABSTRACT

A semiconductor package having a heat sink attached to a substrate is provided. The semiconductor package includes a substrate for mounting at least one semiconductor chip thereon; wherein the semiconductor chip is electrically connected to the substrate and a plurality of positioning holes formed on the substrate for being engaged with a plurality of positioning portions formed on the heat sink, allowing the heat sink to be securely fixed to the substrate. Thus dislocation of the heat sink on the substrate can be effectively prevented during the molding process.

15 Claims, 2 Drawing Sheets

SEMICONDUCTOR PACKAGE HAVING HEAT SINK ATTACHED TO SUBSTRATE

FIELD OF THE INVENTION

This invention relates to semiconductor packages and, more particularly to a semiconductor package having a heat sink for improving heat dissipating efficiency.

BACKGROUND OF THE INVENTION

In recent years, semiconductor devices are in the rapid development for high integration, miniaturization and high performance with the trends of producing downsized electronic devices of high performance. The use of a ball-grid-array (BGA) substrate in a semiconductor device can maximize the number of input/output connections and allow a semiconductor chip adhered to the ball-grid-array substrate to have an increased density of built-in electronic components and electric circuits, contributing to the miniaturization and high performance of semiconductor devices. The semiconductor chip encapsulated in a ball-grid-array semiconductor device may contain higher density of electronic circuits and electronic components, but the heat generated therefrom during operation will significantly increase. Also the encapsulation body used to encapsulate the semiconductor chip is made of resin material with poor thermal conductivity. As a result, if the thermal dissipating efficiency of the ball-grid-array semiconductor device is not satisfactory, the electronic performance and operable life of the semiconductor device would be adversely affected.

Various methods of providing satisfactory heat dissipation to BGA semiconductor devices have been proposed. An example of a semiconductor device with an incorporated heat sink is illustrated in FIG. 9. A semiconductor chip 10 is mounted on a substrate 11, on which a heat sink 12 is mounted by thermosetting adhesive 13. An encapsulation body 14 formed by molding resin is then used to encapsulate the semiconductor chip 10 and heat sink 12. The heat sink 12 of the semiconductor device consists of a flat portion 15 and a supporting portion 16 connecting to the flat portion 15. The supporting portion 16 of the heat sink 12 is arranged in a manner to allow the flat portion 15 of the heat sink 12 to be separated from the substrate 11. Thus after mounting the heat sink 12 onto the substrate 11, the semiconductor chip 10 is positioned underlying the flat portion 15 of the heat sink 12.

The above-mentioned semiconductor package, however, still has drawbacks. During the process of adhering the heat sink 12 to the substrate 11, the heat sink 12 tends to be dislocated from a predetermined position on the substrate 11. The foregoing problem is usually caused by vibration of the equipment used for adhering the heat sink 12 to the substrate 11 and inadvertent operation during the adhering process. Moreover, the dislocation of the heat sink 12 may cause the heat sink 12 to be in contact with gold wires 17 that electrically connect the semiconductor chip 10 and the substrate 11, thereby resulting in a reliability problem of the product thus-obtained.

SUMMARY OF THE INVENTION

It is therefore the objective of the present invention to provide a semiconductor package having a heat sink that can be securely positioned on the substrate. As the heat sink can be securely positioned on the substrate, dislocation problem of the heat sink can be eliminated and the reliability of the semiconductor devices can be enhanced.

To achieve the above and other objectives of the present invention, a semiconductor device is provided to include: a substrate having a first surface, a second surface opposing the first surface, a die-attach region formed on the first surface of the substrate, a plurality of positioning holes formed on the substrate and arranged peripherally around the die-attach region; a semiconductor chip attached to the die-attach region of the substrate and electrically connected to the substrate; a heat sink composed of a flat portion, a supporting portion integrally formed with the flat portion so as to elevate the flat portion to a predetermined height above the semiconductor chip, and a plurality of positioning portions protruded form the bottom of the supporting portion for being engaged with the corresponding positioning holes of the substrate to thereby securely fix the heat sink in position to the substrate; a plurality of electrical conductive elements disposed on the second surface of the substrate; and an encapsulation body which encapsulates the entire semiconductor chip and at least a portion of the heat sink.

The substrate usually consists of a core layer having a top surface, a bottom surface opposing the top surface, a plurality of electrically conductive traces formed on at least one of the top surface and the second surface of the core layer, and solder mask layers formed on the top and bottom surfaces of the core layer.

In a preferred embodiment of the invention, a plurality of through holes are formed within an area of the core layer without formation of the electrically conductive traces. After the coating process of applying the solder mask onto the top surface and the bottom surface of the core layer is completed, a conventional etching process or the like is employed to remove the solder mask formed above the through holes and a portion of the solder mask filled within the through holes, so as to form the positioning holes that extend from the first surface of the substrate to an inner portion of the core layer. This allows each of the positioning holes to have one end exposed to the first surface of the substrate and another end closed by the solder mask.

In another embodiment of the invention, a plurality of through holes are formed on an area of the core layer which is free of electrically conductive traces. By a conventional etching process or the like following applying the solder mask over the core layer, the solder mask above the through holes, within the through holes, and below the through holes is removed to form the positioning holes. Thus the positioning holes extend through the substrate.

In still another embodiment of the present invention, on the ground pad formed on the terminal of each of the ground conductive traces an opening is formed, allowing a positioning hole to form by removing the solder mask above and within the opening by conventional etching technique. The positioning hole thus-formed therefore extends from the first surface of the substrate to the top surface of the core layer. As a result, the heat sink can be not only securely fixed to the substrate by the engagement of the positioning portions of the heat sink with the positioning holes formed on the substrate, but also electrically connected to the ground conductive traces on the substrate. Therefore, the electrical performance of the semiconductor package of this invention can be enhanced.

In still another embodiment of the present invention, a plurality of through holes are formed on predetermined positions of the core layer. Each of the through holes is arranged to connect an opening formed on the terminal of each of the ground conductive traces on the core layer. Therefore, a positioning hole can be formed by removing the solder mask above the opening, within the opening and in the upper portion of the through hole via conventional etching technique or the like. By this arrangement, the heat sink is allowed to have an electrical-connection relationship with the ground conductive traces on the substrate, in addition to the secure fixing of the heat sink to the substrate.

In still another embodiment of the present inventions, the formation of a positioning hole is achieved by removing the solder mask above and within an opening formed on the ground pad of the terminal of the ground conductive trace, the solder mask within a through hole formed in the substrate relative in position to the opening and the solder mask below the through hole. Therefore, the positioning hole extends through the substrate.

In still another embodiment of the present invention, the formation of a positioning hole includes an opening formed on the ground pad connected to the terminal of the ground conductive trace formed on the bottom surface of the core layer, allowing a ground ball to be bonded to the opening of the ground pad on the bottom surface of the core layer. This makes the heat sink, ground conductive traces, positioning holes and the ground balls in combination form a grounding circuit so that the electrical performance of the semiconductor package of the present invention can be enhanced.

In still another embodiment of the present invention, the positioning hole is formed in a manner that the diameter of an upper portion of the positioning hole is substantially larger than that of a lower portion of the positioning hole. Likewise, the positioning portions of the heat sink each is formed a corresponding stepped profile. Thus an enhanced anchoring effect is obtained between the positioning holes and the positioning portions. Moreover, an enhanced interconnection between the heat sink and the substrate is further achieved to prevent the delamination occurred therebetween.

BRIEF DESCRIPTION OF THE DRAWINGS

The invention can be more filly understood by reading the following detailed description of the preferred embodiments, with reference made to the accompanying drawings, wherein.

DETAILED DESCRIPTION OF THE PREFERRED EMBODIMENT

First Embodiment

Figure 1:
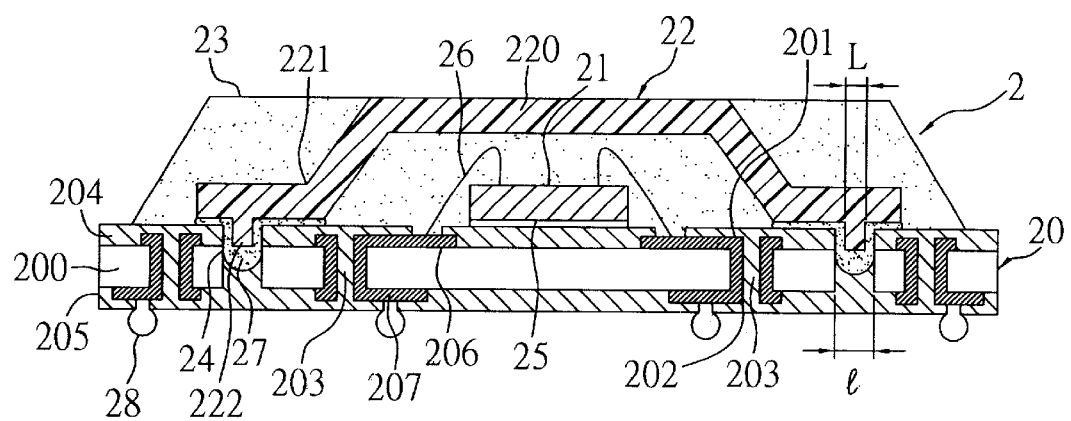
FIG. 1 is a cross sectional view of a semiconductor device in accordance with a first embodiment of the present invention.

FIG. 1 illustrates a first embodiment of the semiconductor device according to the present invention. As shown in the drawing, the semiconductor device 2 is composed of a substrate 20, a semiconductor chip 21 mounted on the substrate 20, a heat sink 22 mounted on the substrate 20, and an encapsulation body 23 used to encapsulate the entire semiconductor chip 21 and a portion of the heat sink 22.

The substrate 20 includes a core layer 200 made of resin material or the like. The core layer 200 has a top surface for a plurality of conductive traces 201 to be formed thereon and a corresponding bottom surface for a plurality of second conductive traces 202 to be formed thereon. The first conductive traces 201 are electrically connected to the second conductive traces 202 through a plurality of vias 203. Further, the first conductive traces 201 of the core layer 20 are covered by a first solder mask 204 coated thereon, and similarly, the second conductive traces 202 of core layer 20 are covered by a second solder mask 205 coated thereon. The application of solder mask is used to protect the conductive traces 201 and 202 from exterior environment.

A plurality of bonding fingers 206 formed on each terminal (not shown) of the first conductive traces 201 are exposed to the exterior of the first solder mask 204. Similarly, a plurality of solder pads 207 formed on each terminal of the second conductive traces 202 are exposed to the exterior of the second solder mask 205. A plurality of positioning holes 24 are peripherally formed around a die-attach region (not shown) of the substrate 20 for the semiconductor chip 21 to adhere thereto. It is to be noted that the solder mask in the positioning holes 24 is removed by conventional etching techniques, to the extent that the positioning holes 24 extend from the first solder mask 204 to an intermediate portion of the core layer 200.

A die bonding process is performed to adhere a semiconductor chip 21 onto the substrate 20 by a conventional adhesive 25 such as silver paste or polyimide tape. The semiconductor chip 21 is then electrically connected to the bonding fingers 206 on the terminals of the first conductive trace 201 via a plurality of gold wires 26 to thereby electrically connect the semiconductor chip 221 to the substrate 20.

The heat sink 22 of the semiconductor package according to the present invention is composed of a flat portion 220; a supporting portion 221 integrally formed with the flat portion 220 for elevating the flat portion 220 to a predetermined height above the semiconductor chip 21; and a plurality of positioning portions 222 protruded from bottoms of the supporting portion 221. The supporting portion 221 is extended outwardly and downwardly from the flat portions 220 to a predetermined length. After mounting the heat sink 22 on a predetermined position of the substrate 20, the supporting portion 221 and the flat portion 220 of the heat sink 22 together define a cavity for receiving the semiconductor chip 21 therewithin. Moreover, the supporting portion 221 of the heat sink 22 is elevated to a predetermined height such that the bottom of the flat portion 220 of the heat sink 22 is spaced with an appropriate distance from the top point of the wire loop of each gold wire 26. The positioning portions 222 of the heat sink 22 are formed on the supporting portion 221 of the heat sink 22 by stamping or other conventional techniques. The diameter L of the positioning portions 222 is required to be smaller than the diameter (l) of the positioning holes 24 on the substrate 20. This arrangement allows the positioning portions 222 of heat sink 22 to be engaged with the positioning holes 24 of the substrate 20 and therefore prevents the heat sink 22 from dislocation from a desired position on the substrate 20. Further, an adhesive 27 is applied to the positioning holes 24 to securely hold the positioning portions 222 of the heat sink 22 in place. As a result, the heat sink 22 is securely fixed to the substrate 20.

The heat sink 22 is made of conductive metal materials, such as copper, aluminum, copper alloy, aluminum alloy, or the combination thereof. According to the present invention, the top surface of the flat portion 220 of the heat sink 22 can be exposed to the exterior of the encapsulation body 23, therefore significantly improving the efficiency of spreading heat generated from the semiconductor chip 21 during operation. Alternatively, the heat sink 22 may also be fully encapsulated by the encapsulation body 23. However, such an arrangement will have a heat-dissipating efficiency inferior to the semiconductor device shown in FIG. 1.

After the molding process for forming the encapsulation body 23 is completed, a plurality of solder bumps 28 are implanted on the lower solder pads 207 exposed on the second surface of the substrate 20 by conventional solder ball-implantation process. The solder bumps 28 are used for electrically connecting to the semiconductor chip 21 to external devices. As the implantation of the solder balls is conventional, detailed description thereto will be hereby omitted for simplification.

Second Embodiment

Figure 2:
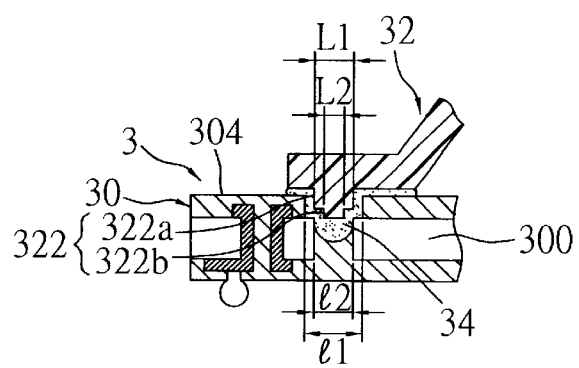
FIG. 2 is an enlarged cross sectional view of a portion of the semiconductor device in accordance with a second embodiment of the present invention.

FIG. 2 illustrates the semiconductor device according to a second embodiment of the present invention.

In contrast to the first embodiment, the positioning holes 34 on the substrate 30 of the semiconductor device 3 each have an enlarged upper portion. In other words, the diameter (l1) of the upper portion of the positioning holes 34 disposed within the first solder mask 304 is larger than the diameter (l2) of the lower portion of positioning holes 34 disposed in the core layer 300. Likewise, the width L1 of the upper portion 322a of the positioning portions 322 is slightly smaller than the diameter (l1) of the upper portion of the positioning holes 34, and the width L2 of the lower portion 322b of the positioning portions 322 is slightly smaller than the diameter (l2) of the lower portion of the positioning holes 34. Further, the diameter L1 of the upper portion 322a of the positioning portions 322 is larger than the diameter L2 of the lower portion 322b thereof This arrangement thus enables the positioning portions 322 of the heat sink 32 to be more securely engaged with the positioning holes 34 of the substrate 30 and therefore results in an improved anchoring effect.

Third Embodiment

Figure 3:
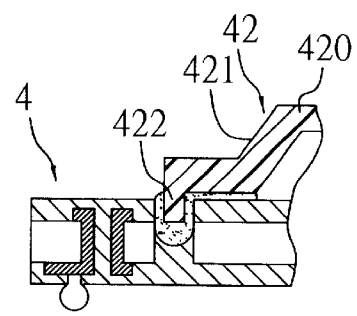
FIG. 3 is an enlarged cross sectional view of a portion of the semiconductor device in accordance with a third embodiment of the present invention.

FIG. 3 illustrates the semiconductor device according to a third embodiment of the present invention.

The heat sink 42 of the third embodiment is composed of a flat portion 420; a supporting portion 421 integrally formed with the flat portion 420 for elevating the flat portion 420 to a predetermined height above the semiconductor chip (not shown); and a plurality of positioning portions 422 formed on the bottom of the supporting portion 421. In contrast to the first embodiment, the positioning portions 422 are formed by vertically and downwardly stamping the edge of the supporting portion 422, thereby making the positioning portions 422 in pillar shape when cross-sectionally viewed.

Fourth Embodiment

Figure 4:
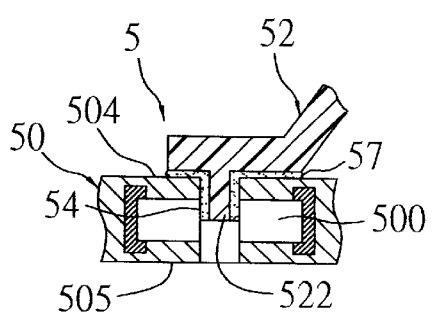
FIG. 4 is an enlarged cross sectional view of a portion of the semiconductor device in accordance with a forth embodiment of the present invention.

FIG. 4 illustrates the semiconductor device according to a fourth embodiment of the present invention.

The semiconductor device 5 illustrated in FIG. 4 is basically the same as that illustrated in FIG. 1, except that the positioning holes 54 in the substrate 50 are formed via conventional etching technique by removing a portion of the first solder mask 504, the core layer 500, and the second solder mask 505, respectively, so as to allow the positioning holes 54 to penetrate the substrate 50. Further, the positioning portions 522 of heat sink 52 are securely positioned within the positioning holes 54 of the substrate 50 by an adhesive 57, allowing the positioning holes 54 to be sealed by the adhesive 57.

Fifth Embodiment

Figure 5:
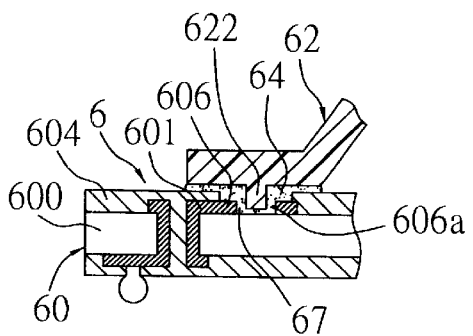
FIG. 5 is an enlarged cross sectional view of a portion of the semiconductor device in accordance with a fifth embodiment of the present invention.

FIG. 5 illustrates the semiconductor device according to a fifth embodiment of the present invention.

The semiconductor device 6 illustrated in FIG. 5 is basically the same as that illustrated in FIG. 1 except that in forming the positioning hole 64, a through hole 606a is formed through the ground pad 606 of the terminal of the first conductive trace 601 formed on the top surface of the core layer 600. The positioning holes 64 are formed by subsequently removing the first soldering mask 604 above and within the through hole 606a. Likewise, the positioning hole 64 extends from the top surface of substrate 60 to the top surface of core layer 600 but not to the inner portion of the core layer 600. Further, the positioning portions 622 of heat sink 62 are securely engaged within the positioning holes 64 of the substrate 60 by an adhesive 67, thereby enabling the heat sink 62 to be electrically connected to the ground pad 606. This arrangement can further enhance the electrical performance and reliability of the packaged semiconductor product.

Sixth Embodiment

Figure 6:
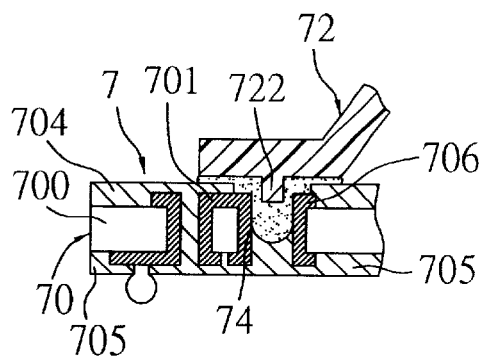
FIG. 6 is an enlarged cross sectional view of a portion of the semiconductor device in accordance with a sixth embodiment of the present invention.

FIG. 6 illustrates the semiconductor device according to a sixth embodiment of the present invention.

The semiconductor device 7 illustrated in FIG. 6 is basically the same as that illustrated in FIG. 1, except that the positioning holes 74 in the substrate 70 are formed by removing a portion of the first solder mask 704, a portion of the ground pad 706 formed on the terminal of the first conductive trace 701, and a portion of the core layer 700 beneath the ground pad 706, respectively. As the bottom end of the positioning hole 74 which is positioned within the core layer 700 is sealed by the second solder mask 705, after the positioning portions 722 of heat sink 72 are securely engaged with the positioning holes 74 of the substrate 70, the heat sink 72 is allowed to be securely fixed to the substrate 70 and therefore prevent the heat sink 72 from being dislocated from the desired position on the substrate 70. Further, a grounding circuit is formed by the electrical connection of the heat sink 72 with the ground pads 706, therefore enhancing the electrical performance and reliability of the packaged semiconductor product.

Seventh Embodiment

Figure 7:
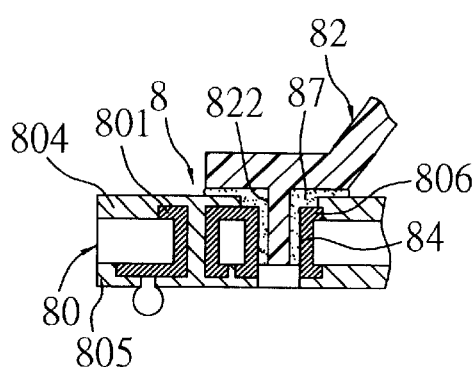
FIG. 7 is an enlarged cross sectional view of a portion of the semiconductor device in accordance with a seventh embodiment of the present invention.

FIG. 7 illustrates the semiconductor device according to a seventh embodiment of the present invention.

The semiconductor device 8 illustrated in FIG. 7 is basically the same as that illustrated in FIG. 1, except that the positioning holes 84 in the substrate 80 are formed by removing a portion of the first solder mask 804, a portion of the ground pad 806 formed on the terminal of the first conductive trace 801, and a portion of the core layer 800 beneath the ground pad 806, and a portion of the second solder mask 805, respectively, thereby allowing the positioning holes 84 to extend through the substrate 80. Further, the positioning portions 822 of heat sink 82 are securely positioned within the positioning holes 84 of the substrate 80 by a conductive adhesive 87, while the positioning holes 84 are sealed by the adhesive 87.

Eighth Embodiment

Figure 8:
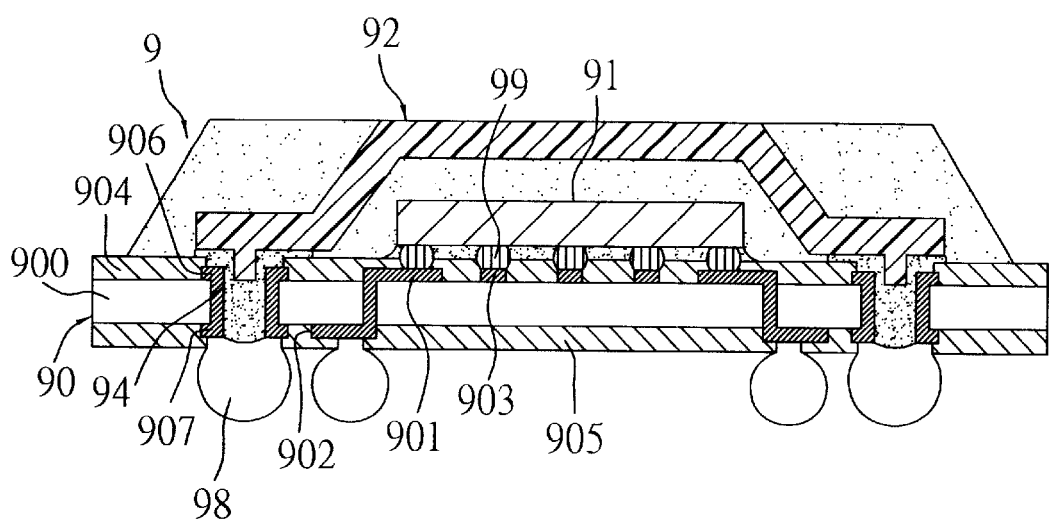
FIG. 8 is an enlarged cross sectional view of a portion of the semiconductor device in accordance with an eighth embodiment of the present invention.
Figure 9:
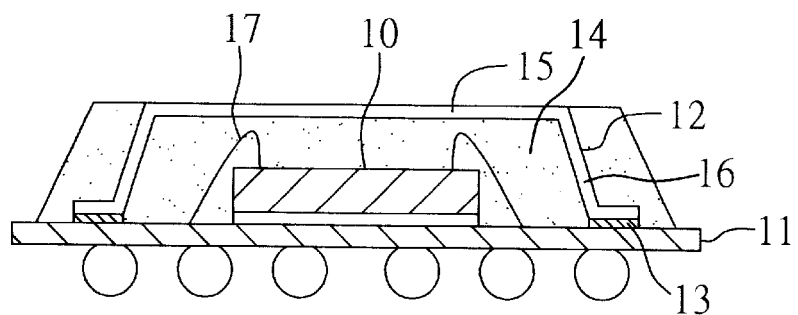
FIG. 9 is a cross sectional view of a structure of a semiconductor device in accordance with the prior art.

FIG. 8 illustrates the semiconductor device according to an eighth embodiment of the present invention.

The semiconductor device 9 illustrated in FIG. 8 is basically the same as that illustrated in FIG. 1 except that a plurality of bond pads 903 arrayedly arranged are disposed on the die-attach region (not shown) on the substrate 90, allowing the semiconductor chip 91 to be electrically connected to the substrate 90 by solder bumps 99 rather than by gold wires used in the previous embodiment. Thus, the requirement of an apron area formed on the substrate in wire bonding process is prevented.

In the eighth embodiment, by conventional etching technique, the positioning holes 94 in the substrate 90 are formed by removing in order, a portion of the first solder mask 904, the ground pads 906 formed on the terminals of the first conductive traces 901, the core layer 900 beneath the ground pads 906, the lower ground pads 907 formed on the terminals of the second conductive traces 902, and the second solder mask 905, respectively. Further, a plurality of ground balls 98 are managed to be bonded to the ground pads 907, thereby facilitating the formation of a grounding circuit formed by the heat sink 92, the ground pads 906, 907, and the ground balls 98.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package having a heat sink attached to a substrate comprising:

a substrate having a first surface, a second surface opposing said first surface, a die-attach region formed on said first surface of said substrate, and a plurality of positioning holes formed on said substrate and arranged peripherally surrounding said die-attach region;

a semiconductor chip mounted on said die-attach region and electrically connected with said substrate;

a heat sink having a flat portion, a supporting portion connected to said flat portion for elevating said flat portion to a predetermined height above said semiconductor chip, and a plurality of positioning portions formed with said supporting portion for being engaged with the positioning holes of said substrate so as to securely fix said heat sink to said substrate;

a plurality of electrical conductive elements disposed on said second surface of said substrate; and an encapsulation body which encapsulates said semiconductor chip and at least a portion of said heat sink;

wherein each said positioning portion is smaller in diameter than its corresponding positioning hole; each said positioning portion has an upper portion with a diameter larger than a lower portion integrally connected therewith; and each said positioning hole has an upper portion with a diameter larger than a lower portion integrally connected therewith.

2. The semiconductor package as recited in claim 1, wherein said positioning portions of said heat sink are adhered to said positioning holes by an adhesive.

3. The semiconductor package as recited in claim 1, wherein said electrical conductive elements are solder balls.

4. The semiconductor package as recited in claim 1, wherein said substrate is composed of a core layer having a top surface and a bottom surface, a plurality of first conductive traces disposed on said top surface of said core layer, a plurality of second conductive traces disposed on said bottom surface of said core layer, a first solder mask formed on said top surface of said core layer, allowing a top surface of said first solder mask to form said first surface of said substrate, and a second solder mask formed on said bottom surface of said core layer, allowing a bottom surface of said second solder mask to form said second surface of said substrate.

5. The semiconductor package as recited in claim 4, wherein said positioning hole extends from said first surface of said substrate to an inner portion of said core layer.

6. The semiconductor package as recited in claim 4, wherein said positioning hole extends from said first surface to said second surface of said substrate.

7. The semiconductor package as recited in claim 4, wherein said positioning holes are formed to include openings formed on ground pads connected to said first conductive traces and openings formed in said first solder mask.

8. The semiconductor package as recited in claim 4, wherein said positioning holes are formed to include openings formed in said first solder mask, openings formed on ground pads connected to said first conductive traces, and openings formed in said core layer.

9. The semiconductor package as recited in claim 4, wherein said positioning holes are formed to include openings formed in said first solder mask, openings formed on ground pads connected to said first conductive traces, openings formed in said core layer and openings formed in said second solder mask.

10. The semiconductor package as recited in claim 4, wherein said positioning holes are formed to penetrate sequentially through said first solder mask, ground pads connected to said first conductive traces, said core layer, said ground pads connected to said second conductive traces, and said second solder mask.

11. The semiconductor package as recited in claim 10, wherein a plurality of ground balls are implanted on said ground pads that are connected to said second conductive traces.

12. The semiconductor package as recited in claim 1, wherein said semiconductor chip is electrically connected with said substrate via a plurality of bonding wires.

13. The semiconductor package as recited in claim 1, wherein said semiconductor chip is electrically connected with said substrate via a plurality of solder bumps.

14. The semiconductor package as recited in claim 1, wherein a top surface of said flat portion of said heat sink is exposed to an exterior of said encapsulation body.

15. A semiconductor package having a heat sink attached to a substrate comprising:

a substrate having a first surface, a second surface opposing said first surface, a die-attach region formed on said first surface of said substrate, and a plurality of positioning holes formed on said substrate and arranged peripherally surrounding said die-attach region;

a semiconductor chip mounted on said die-attach region and electrically connected with said substrate;

a heat sink having a flat portion, a supporting portion connected to said flat portion for elevating said flat portion to a predetermined height above said semiconductor chip, and a plurality of positioning portions formed with said supporting portion for being engaged with the positioning holes of said substrate so as to securely fix said heat sink to said substrate;

a plurality of electrical conductive elements disposed on said second surface of said substrate; and an encapsulation body which encapsulates said semiconductor chip and at least a portion of said heat sink;

wherein each positioning portion includes an upper portion and a lower portion integrally connected therewith, the upper portion having a diameter larger than the lower portion; each positioning hole includes an upper portion and a lower portion integrally connected therewith, the upper portion having a diameter larger than the lower portion; and the upper and lower portions of each positioning portion are smaller in diameter than the respective upper and lower portions of each positioning hole.

* * * * *